(12) United States Patent
Eitan et al.

(10) Patent No.: US 6,233,180 B1
(45) Date of Patent: May 15, 2001

(54) DEVICE FOR DETERMINING THE VALIDITY OF WORD LINE CONDITIONS AND FOR DELAYING DATA SENSING OPERATION

(75) Inventors: Boaz Eitan, Ra'anana; Oleg Dadashev, Hadera, both of (IL)

(73) Assignees: Saifun Semiconductors Ltd., Netanya; Tower Semiconductors Ltd., Migdal Haemek, both of (IL)

( * ) Notice: Subject to any disclaimer, the term of this patent is extended or adjusted under 35 U.S.C. 154(b) by 0 days.

(21) Appl. No.: 09/244,454

(22) Filed: Feb. 4, 1999

(51) Int. Cl.[7] ...................................... G11C 7/08
(52) U.S. Cl. ........................ 365/196; 365/194; 365/193; 365/210; 365/189.07
(58) Field of Search ..................... 365/194, 196, 365/210, 193, 189.07, 195

(56) References Cited

U.S. PATENT DOCUMENTS

| | | | |
|---|---|---|---|
| 4,916,671 | 4/1990 | Ichiguchi | 365/233 |
| 5,477,499 | 12/1995 | Van Buskirk et al. | 365/218 |
| 5,963,465 | 10/1999 | Eitan | 365/63 |
| 6,128,226 | * 10/2000 | Eitan et al. | 365/185.21 |

* cited by examiner

Primary Examiner—Andrew Q. Tran (57) ABSTRACT

A delay device for delaying the activation of a sensing indication signal includes a reference word-line, a reference word-line driver, and a comparator. The reference word-line driver is controlled by a strobe signal, and is connected to the reference word-line and a reference word-line voltage. Additionally, when so indicated by the strobe signal, the reference word-line driver provides the reference word-line voltage to the reference word-line. The comparator is connected to the reference word-line and to the reference word-line voltage and activates the sensing indication signal when the voltage on the reference word-line is at least equal to a predetermined function of the reference word-line voltage.

14 Claims, 6 Drawing Sheets

DEVICE FOR DETERMINING THE VALIDITY OF WORD LINE CONDITIONS AND FOR DELAYING DATA SENSING OPERATION

CROSS REFERENCE TO RELATED APPLICATIONS

This application is related to U.S. application Ser. No. 09/244,439 entitled "Method and Apparatus for Operating with a Close to Ground Signal", filed on the same day herewith, now U.S. Pat. No. 6,128,226.

FIELD OF THE INVENTION

The present invention relates to methods and devices for timing data retrieval in semiconductor memory systems, in general, and to methods and devices for determining the validity of word-line conditions, in particular.

BACKGROUND OF THE INVENTION

Memory devices, such as random access memory (RAM), read only memory (ROM), non-volatile memory (NVM) and the like, are known in the art. A memory device includes an array of memory cells and peripheral supporting systems for managing programming and data retrieval operations.

Figure 1:
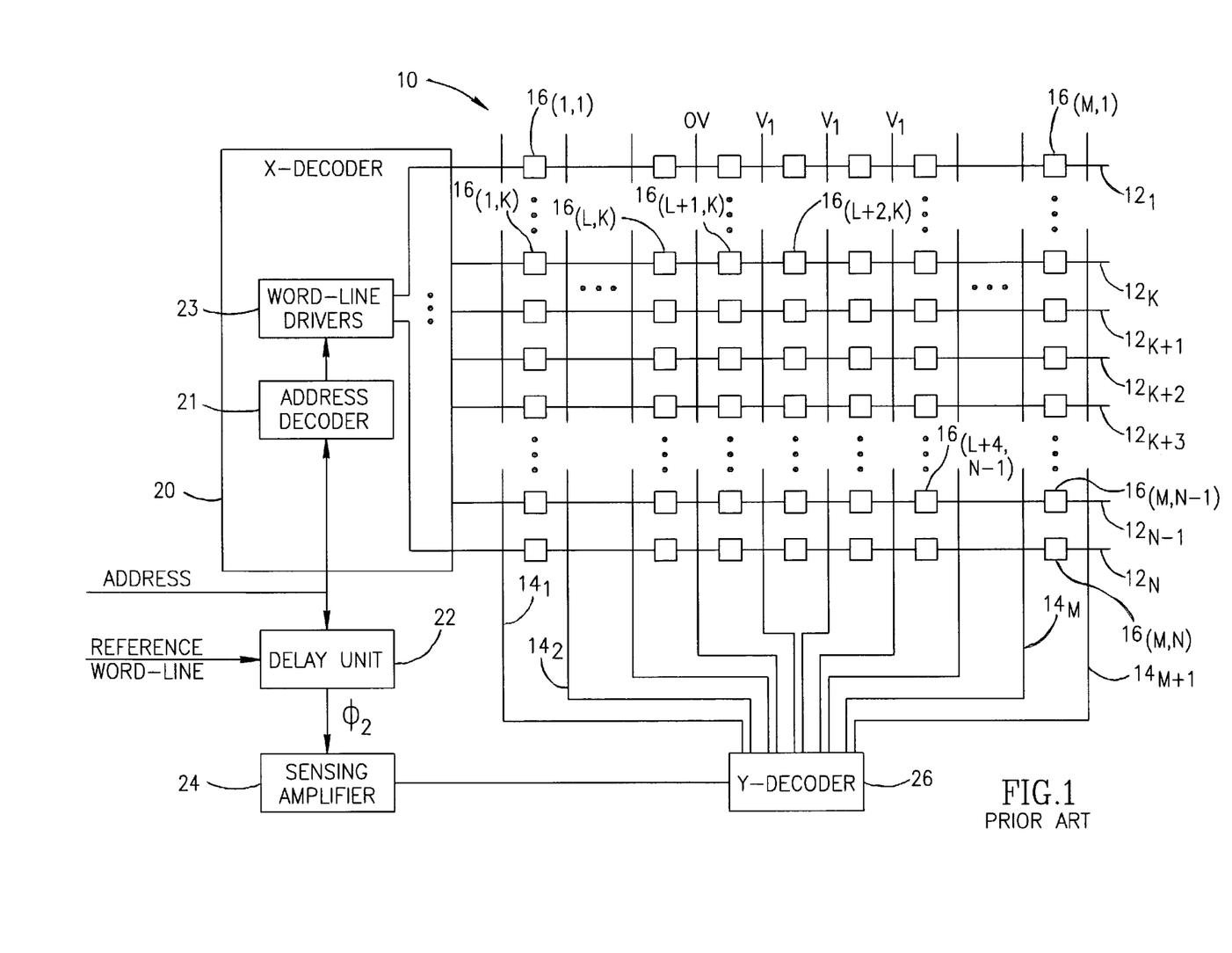
FIG. 1 is a schematic illustration of a prior art memory device.

Reference is now made to FIG. 1, which is a schematic illustration of a memory device, generally referenced 10, which is known in the art.

Device 10 includes a plurality of memory cells, generally referenced 16, an X-decoder 20, a Y-decoder 26, a delay unit 22, and a sensing amplifier 24.

The memory cells 16 are arranged in an array, in the form of an N×M matrix. Access to the cells is performed via a plurality of bit lines, generally referenced 14, and a plurality of word-lines, generally referenced 12. Each memory cell 16 is connected to one word-line 12 and between two neighboring bit lines 14.

For example, all of the cells in the left column, such as cells $16_{(1,1)}$ and $16_{(1,K)}$, are connected between bit-lines $14_1$ and $14_2$. Cells 16 which are located in the same row are connected to the same word-line 12. For example, all of the cells 16 in the Kth line, such as cells $16_{(1,K)}$, $16_{(L,K)}$, $16_{(L+1,K)}$ and $16_{(L+2,K)}$, are connected to word-line $12_K$.

A cell 16 can be accessed by providing predetermined voltage levels to the word-line 12 and the bit-lines 14 which are connected thereto. The gate of the cell receives a predetermined voltage level signal via the respective word-line 12, and the source and drain of the cell receive different voltage level signals, each from its respective bit-line 14.

The bit-lines 14 are selected using Y-decoder 26, which connects them to voltage sources (not shown) and to sensing amplifier 24. A word-line 12 is selected using the X-decoder 20 which includes an address decoder 21 and a plurality of word-line drivers 23, each activating a specific word-line 12 when so indicated by the address decoder 21.

It is noted that the selection process of X-decoder 20 takes a considerable period of time, particularly due to the operations of the address decoder 21. This time period varies according to a plurality of aspects, such as the length of the path to the selected word-line 12, the environmental conditions (voltage supply, temperature, manufacturing process), and the like.

The sensing amplifier 24 should begin the sensing procedure only after the gate voltage provided to the selected word-line 12 reaches a predetermined threshold level. To ensure this, the memory device includes a delay unit 22 which provides a control signal $\Phi_2$ to sensing amplifier 24. When control signal $\Phi_2$ indicates that the word-line voltage has exceeded the predetermined threshold level, sensing amplifier 24 commences the sensing procedure.

Methods for determining the length of delay which delay unit 22 implements (i.e., the period from the time that the X-decoder 20 receives a command to select a specific word-line until the time that the voltage on that specific word-line exceeds the threshold level) are known in the art.

One of these methods includes detecting the actual voltage on the selected word-line. As such, a reference word-line is fed directly into delay unit 22. Typically the reference word-line is a specific word-line, such as word-line $12_K$. Hence, the actual voltage from the specific word-line itself is detected, thus avoiding the task of determining the voltage level.

However, this method is very complex and hard to implement, since it requires tapping directly to the selected word-line and detecting the voltage level thereon. Furthermore, in order to implement this method, each word-line in the array must be hooked up to a switch and a comparator, a solution which requires large chip area.

In another method, the reference-word line fed into the delay unit is a DC reference line. In such an instance, the DC reference line is connected to a capacitor and a resistor, thus providing a built-in delay signal. This method however, gives a signal without any matching to the word-line.

Yet another method includes determining the delay by fixed predetermined delay calculations which take into consideration the structure of the X-decoder 20, the memory circuit, the range of the $V_{CC}$ voltage levels which are provided to the device, and the like.

Figure 2A:
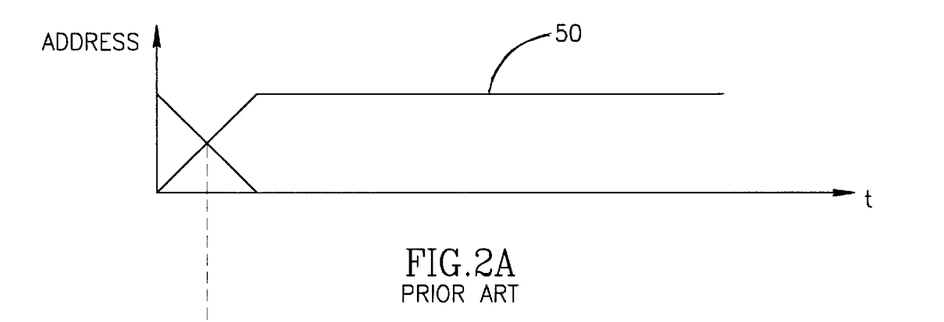
FIG. 2A is a graphical illustration of a conventional, prior art, address signal.
Figure 2B:
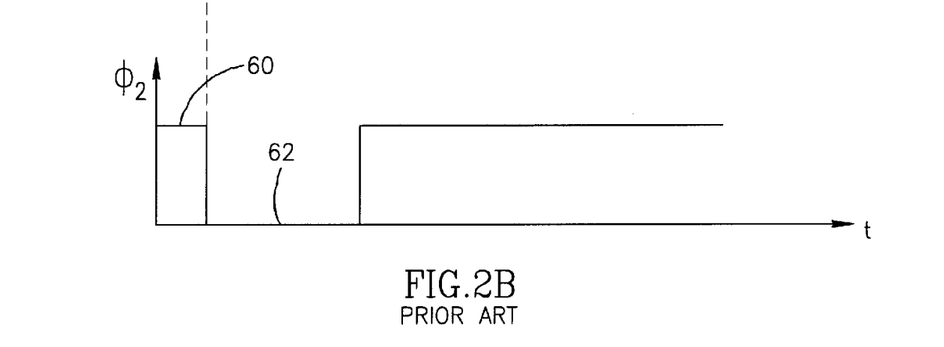
FIG. 2B is a graphical illustration of a prior art control signal.

Reference is further made to FIGS. 2A and 2B, which are timing diagrams known in the art. FIG. 2A illustrates a conventional address signal, generally referenced 50, and FIG. 2B illustrates control signal $\Phi_2$.

Upon receipt of address signal 50, both delay unit 22 and address decoder 21 begin operation. Delay unit 22 initially causes control signal $\Phi_2$ to descend, thereby deactivating sensing amplifier 24, after which delay unit 22 waits a predetermined delay, generally referenced 62. Meanwhile, the address decoder 21 decodes the address and activates the relevant word-line driver 23 to provide voltage to the selected word-line 12. At the end of predetermined delay 62, which is longer than the expected time required for the selected word-line 12 to reach or exceed the predetermined threshold level, delay unit 22 causes control signal $\Phi_2$ to rise, thereby activating sensing amplifier 24.

It is noted that it is often very difficult to accurately determine the point at which the word-line voltage exceeds the predetermined threshold, since this level is subject to change according to a plurality of factors.

To overcome this phenomena, the delay time period is often set much longer than necessary so as to comply with the worst case which might occur. In such an instance, since the delay time period is prolonged, it is possible to by-pass sensing amplifier 24 entirely, and thus, delay unit 22 connects directly to Y-decoder 26. In such an example, delay unit 22 directly actives the Y decoder 26. It will be appreciated by those skilled in the art that by doing so, a considerable amount of time is wasted and the device operates much slower than desired.

SUMMARY OF THE PRESENT INVENTION

It is an object of the present invention to provide a dynamically determined delay.

There is therefore provided in accordance with a preferred embodiment of the present invention, a delay device for delaying the activation of a sensing indication signal. The delay device includes a reference word-line, a reference word-line driver and a comparator.

The reference word-line driver is connected to the reference word-line and a power supply, and is controlled by a strobe signal. Additionally, when so indicated by the strobe signal, the reference word-line driver provides a power supply voltage to the reference word-line.

The comparator is connected to the reference word-line and to the power supply, and activates the sensing indication signal when the voltage on the reference word-line is at least equal to a predetermined function of the power supply voltage.

In a preferred embodiment, the reference word-line includes a word-line or a portion of a word-line.

The comparator includes a controller for supplying power to the comparator during an active mode of an array, and for not supplying power during a standby mode of the array.

There is therefore provided in accordance with a preferred embodiment of the present invention, a delay device for determining a data sensing delay. The delay device includes a reference word-line, and a comparator connected to the reference word-line and to a power supply. When the voltage on the reference word-line is at least equal to a predetermined function of the power supply voltage, the comparator activates a sensing signal.

There is therefore additionally provided in accordance with a preferred embodiment of the present invention, a memory array which includes an array of memory cells. The rows of the memory cells are connected via word-lines and the columns of the memory cells are connected via bit lines. The memory array also includes a reference word-line.

The memory array additionally includes a Y-decoder, an X-decoder, a sensing amplifier, and a delay device. The Y-decoder selects at least one bit line while the X-decoder selects a word-line. The sensing amplifier then senses the value present on the selected bit line.

The delay device charges the reference word-line and once the reference word-line achieves a predetermined voltage level, activates the sensing amplifier.

Preferably the X-decoder includes an address decoder for selecting the word-line and a plurality of word-line drivers connected to the word-lines. The address decoder has a first and a second stage, wherein the second stage is activated by a strobe signal, and once activated, charges a selected one of the word-line drivers.

The delay device includes a reference word-line driver and a second stage emulator. The second stage emulator is activated by the strobe signal, and once activated, charges the reference word-line driver.

Additionally, preferably the delay device includes a comparator, connected to the reference word-line and to a power supply. When the voltage on the reference word-line is at least equal to a predetermined function of the power supply voltage, and the delay device produces an activation signal.

There is therefore provided in accordance with a preferred embodiment of the present invention, a comparator including a first level shifter, a second level shifter, and a current mirror.

The first level shifter is connected to a word-line, and shifts the word-line voltage down by a first down-shifting voltage, thus providing a first shifted voltage The second level shifter, connects to a reference word-line, and shifts the referenced word-line voltage down by a second down-shifting voltage, thus providing a second shifted voltage.

The current mirror connects to the first level shifter and the second level shifter, and attempts to ensure that the first down-shifting voltage and the second down-shifting voltage are generally the same.

Preferably, the comparator includes a voltage divider connected to a word-line, for providing a reduced word-line voltage to the first level shifter. Additionally preferably, the comparator includes a power supply for supplying power during an active mode of an array, and alternately not supplying power during a standby mode of the array. Furthermore preferably, the word-line connects to a voltage divider, which provides a reduced word-line voltage to the first level shifter.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The present invention provides a dynamic delay unit to determine the length of the delay for the current environment.

Figure 3A:
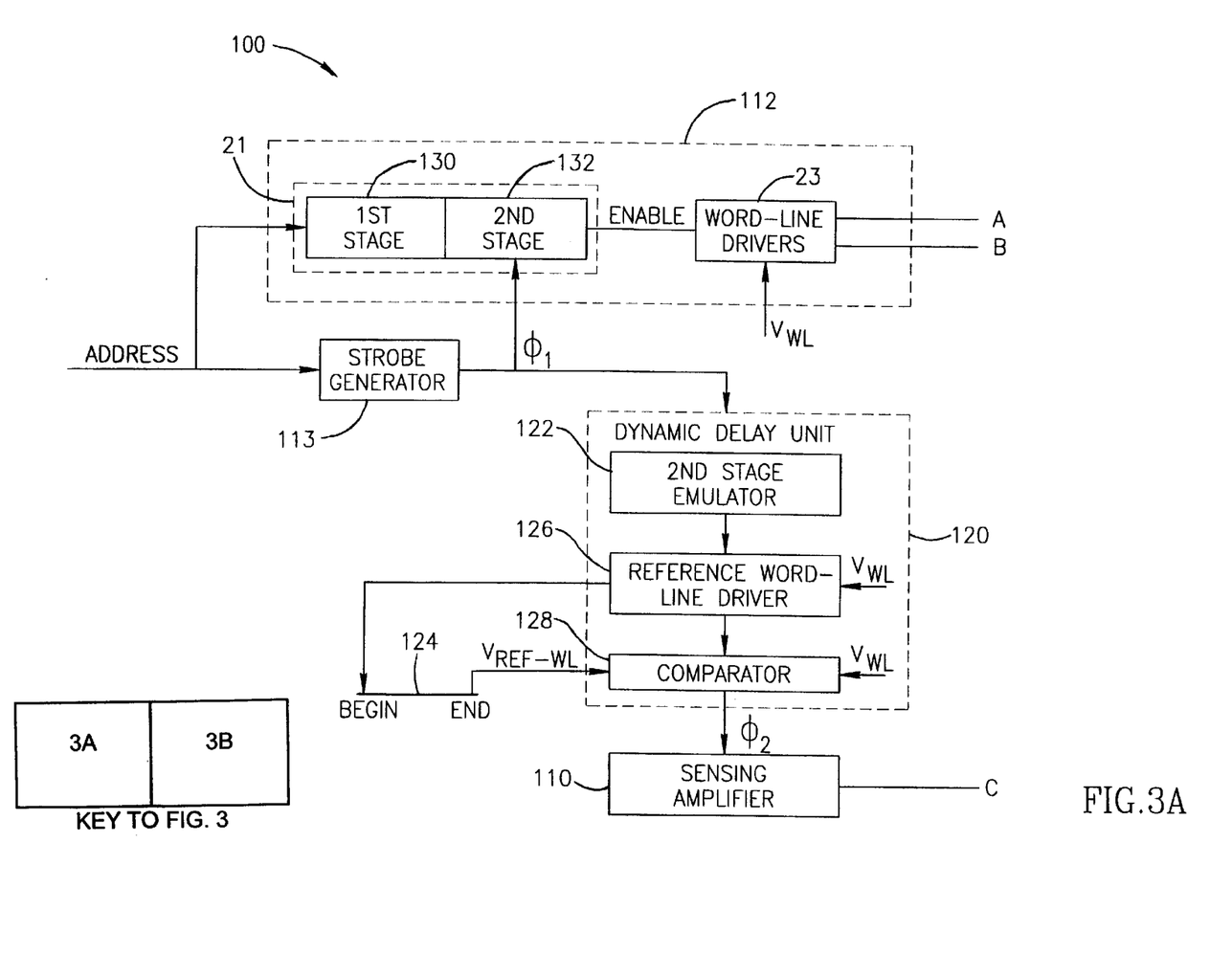
FIG. 3, consisting of FIGS. 3A and 3B arranged as shown in the "KEY TO FIG. 3," is a schematic illustration of a memory device, constructed and operative in accordance with a preferred embodiment of the present invention.
Figure 3B:
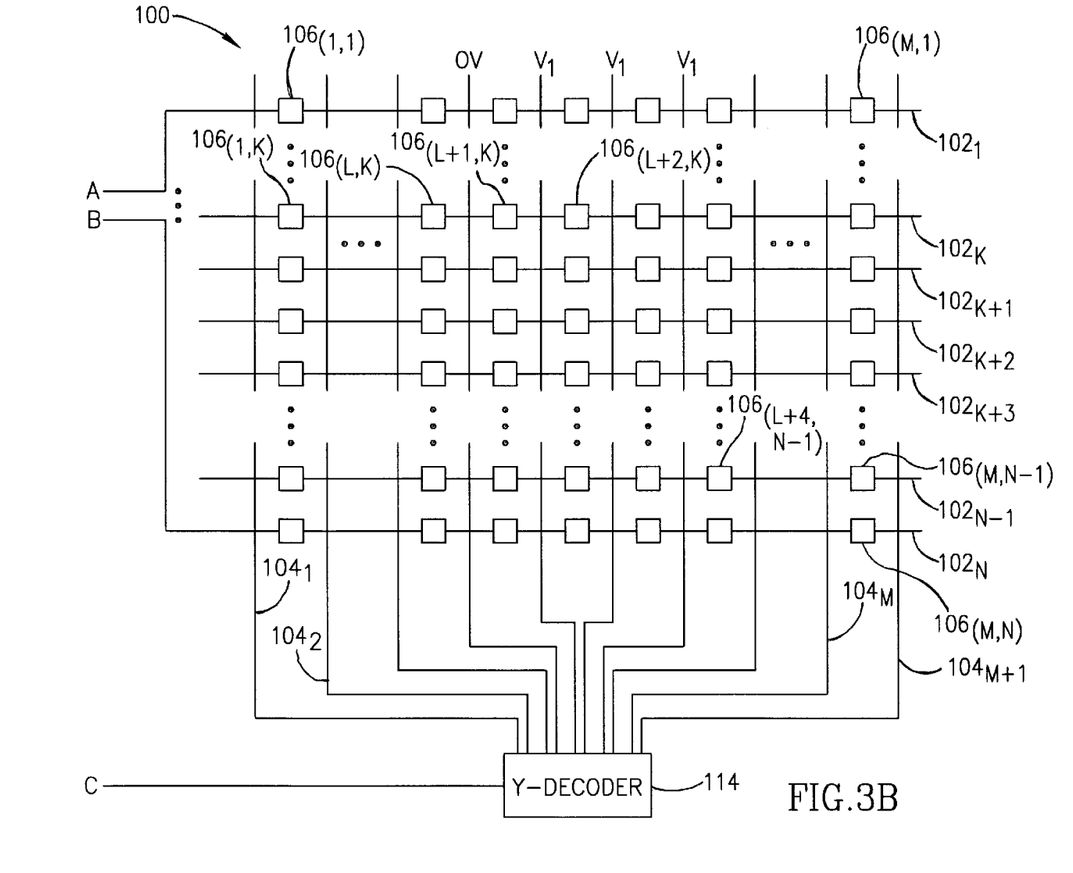

Reference is now made to FIG. 3, which is a schematic illustration of a memory device, generally referenced 100, constructed and operative in accordance with a preferred embodiment of the present invention. Reference is also made to FIGS. 4A, 4B, 4C, 4D and 4E which are timing diagrams useful in understanding the operation of the device of FIG. 3.

Memory device 100 includes a plurality of memory cells 106, a plurality of word lines 102 and a plurality of bit lines 104, arranged in an array, a strobable X-decoder 112, a strobe generator 113, a Y-decoder 114, a dynamic delay unit 120, a sensing amplifier 110, and a reference word-line 124.

As in the prior art, the memory cells 106 are arranged in a matrix and are accessed by word lines 102 and bit lines 104. The notation used for FIG. 1 is used in FIG. 3 as well.

As in the prior art of FIG. 1, strobable X-decoder 112 is connected to the word-lines 102 and provides access thereto. The Y-decoder 114 is connected to the bit-lines 104 and provides access thereto. The dynamic delay unit 120 is connected to strobable X-decoder 112, sensing amplifier 110, and reference word-line 124.

It is noted that reference word-line 124, according to one aspect of the present invention, is a separate word-line, which preserves the basic characteristics (structure, resistive and capacitive loads) of the respective word-line of the selected memory cell. According to another aspect of the invention, reference word-line 124 includes a portion of a word-line.

As in the prior art, the strobable X-decoder 112 comprises address decoder 21 and word-line drivers 23. In accordance with a preferred embodiment of the present invention, address decoder 21 is divided into two stages: a first stage 130 and a second stage 132.

Figure 4A:
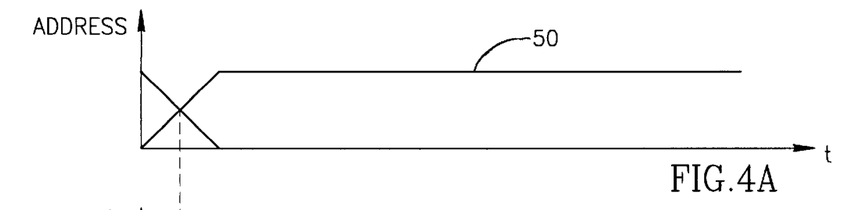
FIG. 4A is a graphical illustration of an address signal similar to that shown in FIG. 2A.
Figure 4B:
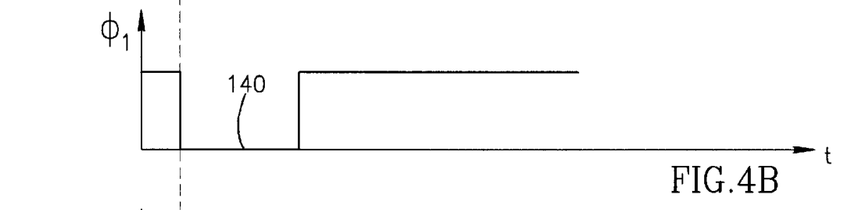
FIG. 4B is a graphical illustration of a strobe signal.
Figure 4C:
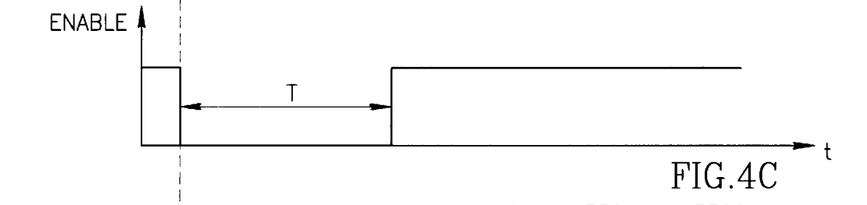
FIG. 4C is a graphical illustration of an OPEN signal, useful in the memory device of the present invention.

Upon receipt of address signal 50 (FIG. 4A), strobe generator 113 changes the state of a strobe signal $\Phi_1$ (FIG. 4B) to indicate the presence of address signal 50. In FIG. 4B, this is produced with a strobe drop 140.

First stage 130 also receives address signal 50 (FIG. 4A) and proceeds with the first stage of decoding of the address signal 50. However, second stage 132 does not commence with its second stage decoding task until strobe signal $\Phi_1$ changes state. Hence, while strobe signal $\Phi_1$ is active, second stage 132 is inactive.

The time period $T_{first\ stage}$ required by first stage 130 to perform address decoding is a variable, but limited amount of time. The time period $T_{second\ stage}$ required by second stage 132 to perform the remaining decoding operation is independent of the addresses and is a predictable amount of time.

In a preferred embodiment of the present invention, the time period $T_{\Phi 1}$ during which the strobe signal $\Phi_1$ is active is set to a time period which is equivalent or greater than $T_{first\ stage}$.

It is therefore preferably noted that:

$T_{\Phi 1} > T_{first\ stage}$

Second stage 132, upon receipt of strobe signal $\Phi_1$ produces an ENABLE signal (FIG. 4C) which drops with or shortly after the drop 140 and which rises after a predetermined period of time T. It is noted that time period T can be determined in a plurality of ways, such as simulating the worst case scenario for decoding an address and setting time period T to it, and the like.

The drop in the ENABLE signal disconnects address decoder 21 from word-line drivers 23. Address decoder 21 can now decode the address signal 50 without affecting the word-lines 102. Address decoder 21 will be reconnected to the word-line drivers 23 at the end of time T, at which point, word-line drivers 23 begin charging the selected word-line 102 with a word-line voltage $V_{WL}$.

It is thus noted that only upon receipt of strobe signal $\Phi_1$ does second stage 132 enable word-line driver 23, and therefore, the charge of the word-lines 102 is determined by the time period set for $T_{\Phi 1}$, which is a known limited time period. Hence, in a preferred embodiment of the present invention, the voltage rise of a word-line 102 is initiated by strobe signal $\Phi_1$, rather than as per prior art methods which endeavored to determine the voltage rise of word line 102, and react thereupon. Thus, memory device 100 makes an improved determination of the voltage rise of word-lines 102.

The dynamic delay unit 120 mimics the word-line operation of strobable X-decoder 112 in order to begin charging reference word-line 124 at the same time that word-line drivers 23 begin charging the selected word-line 102. Thus, unit 120 comprises a second stage emulator 122, which emulates the operation of second stage 132 and controls an ENABLE signal of its own, and a reference word-line driver 126, which provides charge to reference word-line 124 when the ENABLE signal so indicates.

It should be noted that in preferred embodiments wherein the reference word-line 124 is a portion of a word-line, reference word-line 124 generally completely emulates the behavior of the array. However, for these embodiments, reference word-line driver 126 has a smaller driving strength. If, as an example, a high power driver were to be used, then since reference word-line 124 is only a portion of a word line, the voltage of reference word line 124 would rise too quickly to emulate the voltage rise of an entire word-line. It is thus desirable to choose a weaker driver 126, one that generally reproduces the behavior of a word-line 102.

It will be appreciated by those skilled in the art that since emulator 122 emulates second stage 132, then the time period required by emulator 122, $T_{EMULATOR}$, is equivant to $T_{second\ stage}$. Preferably second stage 132 and emulator 122 both produce their respective ENABLE signals relatively simultaneously. It is therefore preferably noted that:

$T_{second\ stage} \approx T_{second\ stage\ emulator}$

It will be appreciated by those skilled in the art that, since word-lines 102 and reference word-line 124 are formed of the same material, have the same physical structures, and are located generally close to one another on the memory device, they should be affected by the same environmental conditions and thus, should respond generally together.

Dynamic delay unit 120 also comprises a comparator 128, connected to reference word-line 124 and to the word-line voltage $V_{WL}$, which compares the rising voltage of reference word-line 124 with a previously defined threshold level $V_{DC-REF}$ (FIG. 4D) which is a function of the word-line voltage $V_{WL}$. Once reference word-line 124 reaches or exceeds threshold level $V_{DC-REF}$, comparator 128 changes the state of control signal $\Phi_2$ to activate sensing amplifier 110. Since reference word-line 124 emulates the selected word-line 102, when comparator 128 so indicates, the selected word-line 102 should be fully charged.

It is noted that reference word line driver 126 receives the beginning portion of reference word line 124, while comparator 128 receives the end portion of reference word-line 124. The reference word line driver 126 provides voltage to the reference word line 124, preferably at the beginning of the reference word-line 124. Once the driver 126 begins charging the reference word-line 124, $V_{REF-WL}$ develops on the reference word-line 124. As such, the signal at the end of the reference word-line 124 is fed into comparator 128, thus providing a natural time delay.

The voltage which exists on the selected word-line 102 is likely to vary according to a plurality of parameters such as temperature, external voltage level supply, and the like. These parameters are likely to change the time period after which the voltage on the word-line 102 exceeds the threshold level. The reference word-line 124, being made of at least a portion of an actual word-line, emulates word-line behavior according to such parameters. Lines 332A, 332B, and 332C of FIG. 4D illustrate such variations in the emulated word-line signal.

Comparator 128 receives the word-line power supply voltage $V_{WL}$ and generates reference signal $V_{DC-REF}$, referenced 330. Comparator 128 compares between emulated word-line signal 332 and reference voltage signal 330. When emulated word-line signal 332 exceeds the level of reference voltage signal 330, then comparator 128 changes the state of control signal $\Phi_2$ (FIG. 4E) which, in turn, activates sensing amplifier 110 (FIG. 3).

Figure 4D:
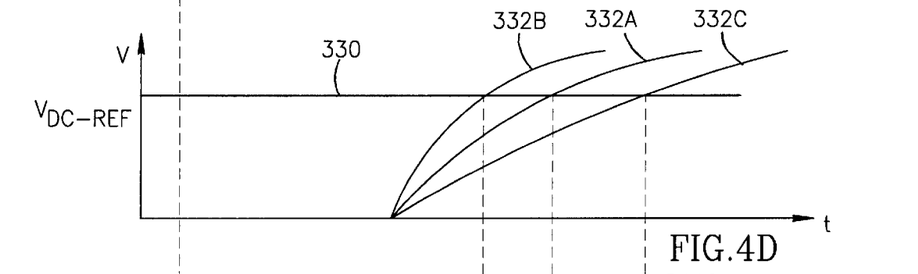
FIG. 4D is a graphical illustration of a word-line power supply voltage signal and a plurality of possible word-line emulation signals, useful in understanding the operation of the memory device of the present invention.
Figure 4E:
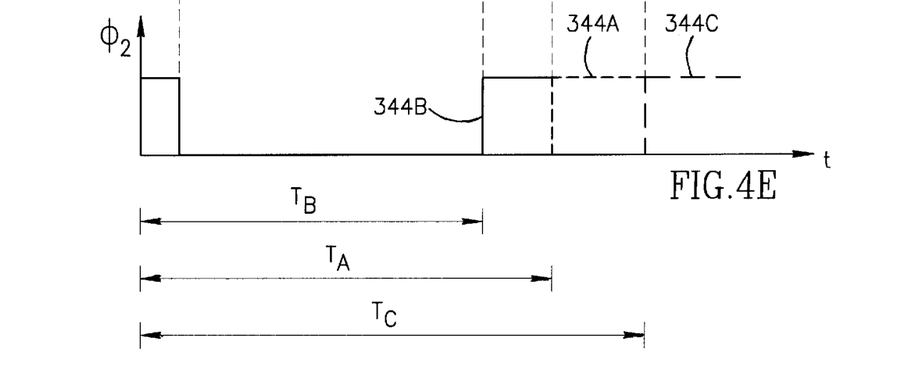
FIG. 4E is a graphical illustration of a plurality of control signals produced by the dynamic delay unit of FIG. 3 in response to the possible word-line emulation signals of FIG. 4D.

As shown in FIGS. 4D and 4E, the overall delay changes as a function of when the emulated word-line signal 332 crosses the reference voltage signal 330. Thus, FIG. 4E shows three control signals 344A, 344B, and 344C corresponding to word-line signals 332A, 332B, and 332C, respectively. As shown in FIG. 4E, control signal 344A has a medium length delay $T_A$, control signal 344B has a short delay $T_B$ and control signal 344C has a long delay $T_C$ corresponding to the fact that word-line signal 332B, crosses reference signal $V_{DC-REF}$ first, followed by signals 332A and 332C.

It will be appreciated that the present invention provides a mechanism which dynamically adjusts the word-line delay according to the various aspects which might affect the actual word-line behavior.

Figure 5:
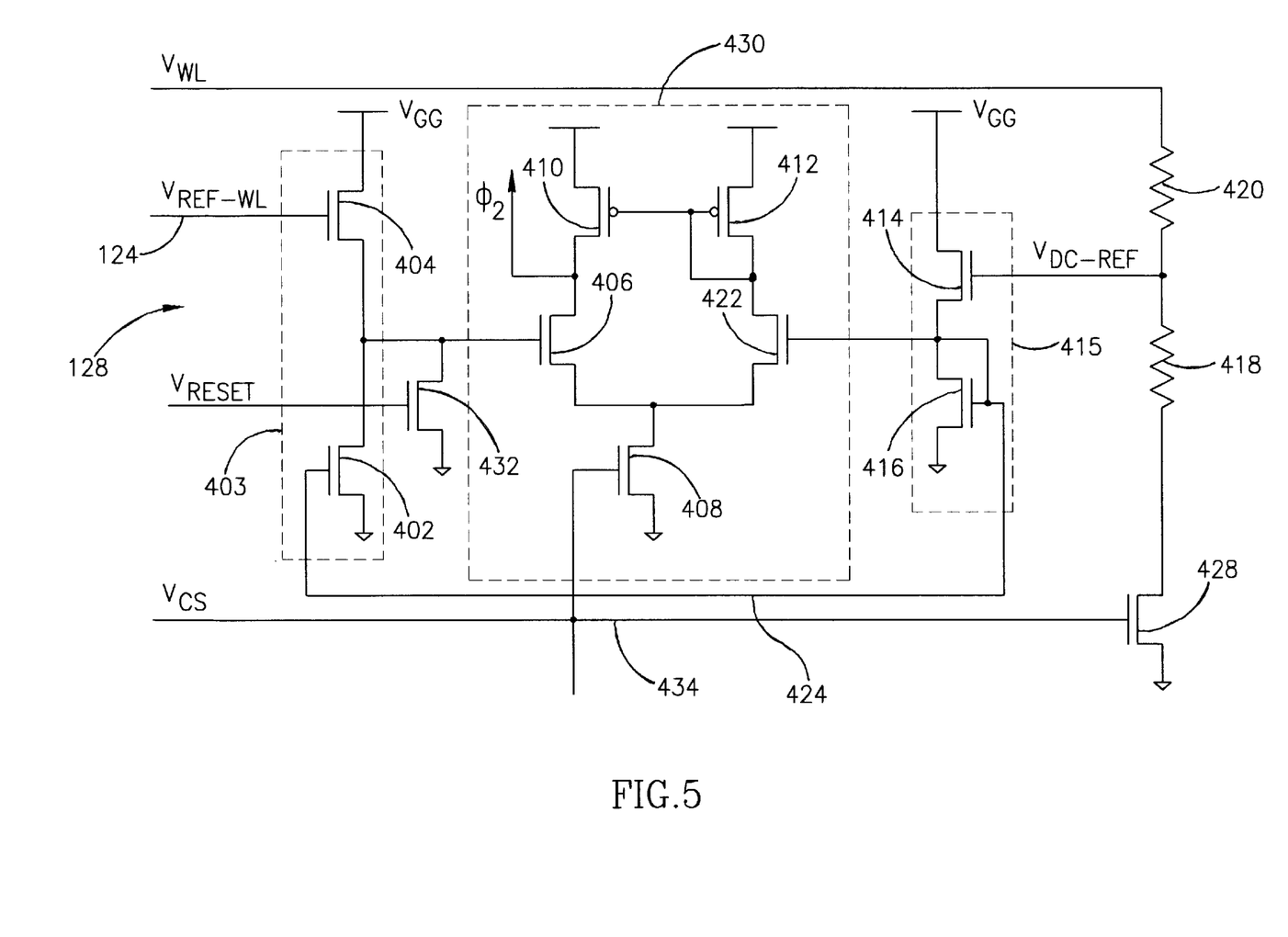
FIG. 5 is a schematic illustration of a comparator forming part of the dynamic delay unit of FIG. 3.

Reference is now made to FIG. 5, which is a schematic illustration of an exemplary comparator 128, constructed and operative in accordance with a further preferred embodiment of the present invention.

Comparator 128 includes a plurality of transistors 402, 404, 406, 408, 410, 412, 414, 416, 422, 428, and 432, and two resistors 420 and 418. Transistors 410 and 412 are P-type transistors, while the rest are N-type transistors.

Transistors 406, 408, 410, 412 and 422 form a differential comparator 430 with the voltage between transistors 406 and 410 producing control signal $\Phi_2$ as output. As differential comparators are well known in the art, the operation of differential comparator 430 will not be described herein.

It is noted that the drains of transistors 404 and 414 are connected to a voltage source $V_{GG}$. It is additionally noted that resistors 420 and 418 form a voltage divider which reduces the incoming word-line voltage power supply $V_{WL}$ by a predetermined ratio, thereby producing $V_{DC-REF}$ (FIG. 4D). The latter is provided to the gate of transistor 414 which, together with transistor 416, forms a first level shifter 415.

Since the voltage levels of the reference voltage $V_{DC-REF}$ and reference word-line voltage $V_{REF-WL}$ are higher than those able to be received by differential comparator 430, the voltage levels of voltages $V_{DC-REF}$ and $V_{REF-WL}$ are shifted down.

Additionally, since the voltage levels of voltages $V_{DC-REF}$ and $V_{REF-WL}$ are too close to that of power source $V_{GG}$, it is difficult for the comparator to sense the differential voltage. Hence, it is desirable to shift down the voltage levels of voltages $V_{DC-REF}$ and $V_{REF-WL}$ in order to increase the differential between their voltages and the voltage level of power source $V_{GG}$.

Thus, first level shifter 415 shifts voltage $V_{DC-REF}$ by a down-shift voltage $V_{1st\ DOWN\ SHIFT}$, producing a first shifted voltage $V_{1st\ SHIFTED}$.

It is therefore preferably noted that:

$$V_{1st\ SHIFTED} = V_{DC-REF} - V_{1st\ DOWNSHIFT}$$

$V_{1st\ SHIFTED}$ is then provided to the gate of transistor 422, thereby providing one of the inputs to differential comparator 430.

Furthermore, reference word-line 124, having a reference word-line voltage $V_{REF-WL}$, is connected to the gate of transistor 404 and thus, controls the voltage level at the gate of transistor 406. Preferably, the impedance of transistor 404 is proportionally much smaller than the impedance of the reference word-line 124, and hence, does not load the word-line.

Transistors 402 and 404 form a second level shifter 403 which shifts the voltage level from the reference word-line voltage $V_{REF-WL}$ by a down-shift voltage $V_{2nd\ DOWN\ SHIFT}$. The output of the level shifter, $V_{2nd\ SHIFTED}$, is provided to the gate of transistor 406, thereby providing the second input to differential comparator 430.

It is therefore preferably noted that:

$$V_{2nd\ SHIFTED} = V_{REF-WL} - V_{2nd\ Downshift}$$

Comparator 128 then compares the levels of reference word-line voltage $V_{REF-WL}$ with the level of reference voltage $V_{DC-REF}$. It is noted that, for the embodiment of FIG. 5, control signal $\Phi_2$ is zero as long as the emulated word-line voltage is lower than $V_{DC-REF}$ and flips to a predetermined voltage level (greater than zero) when $V_{REF-WL}$ is greater than $V_{DC-REF}$.

In a preferred embodiment of the present invention, the gate of transistor 416 is connected to the gate of transistor 402 and thus forms a current mirror 424. Current mirror 424 carries current from transistor 416 to transistor 402.

It is noted that the gate of transistor 404 and the gate of transistor 414 both receive voltages which are derivatives of the word-line voltage supply $V_{WL}$, (e.g., reference word-line voltage $V_{REF-WL}$ and divider voltage $V_{DC-REF}$, respectively). Additionally, as described hereinabove, the gates of both transistor 416 and transistor 402 receive the same voltage level. Hence, a preferred embodiment of the present invention, current mirror 424 attempts to ensure that level shifter 415 and level shifter 403 both shift down by the same voltage level; e.g., that $V_{1st\ DOWN\ SHIFT} = V_{2nd\ DOWNSHIFT}$. The matching serves to prevent a mismatch in the voltage shift level, resulting in a DC offset in the comparator.

Additionally, since both reference voltage $V_{DC-REF}$ and reference word-line voltage $V_{REF-WL}$ are derivatives of word-line voltage supply $V_{WL}$, when the word-line voltage supply $V_{WL}$ varies due to disturbances in the line and such, both voltages $V_{DC-REF}$ and $V_{REF-WL}$ vary proportionally and thus are matched.

In a preferred embodiment of the present invention, a control signal line 434 having a control voltage $V_{CS}$ connects to the gates of transistors 428 and 408. When control signal line 434 senses a transition in the address signal indicating that the array is active, $V_{CS}$ rises, activating transistors 408 and 428, which in turn activates differential comparator 430. When control signal line 434 senses a transition in the address signal indicating that the array is in standby, $V_{CS}$ descends, deactivating transistors 408 and 428, which in turn deactivates differential comparator 430.

Hence, differential comparator 430 is operative when the array is active, and non-operative during stand-by. Thus, comparator 128 alternately draws power and is alternately idle, hence utilizing less power than would be necessary if differential comparator 430 was continuously operative.

Optionally, comparator 128 also comprises a reset transistor 432 (n-channel transistor) whose gate receives a reset signal $V_{RESET}$. While comparator 128 performs a comparison, $V_{RESET}$ is low, closing transistor 432 and allowing data to flow to differential comparator 430. After completion of a comparison, $V_{RESET}$ goes high, opening reset transistor 432 and grounding comparator 430.

It will be appreciated by persons skilled in the art that the present invention is not limited to what has been particularly shown and described hereinabove. Rather the scope of the present invention is defined only by the claims which follow.

What is claimed is:

1. A delay device for delaying the activation of a sensing indication signal, the delay device comprising:

a reference word-line;

a reference word-line driver, connected to said reference word-line and a reference word-line voltage and controlled by a strobe signal, for providing said reference word-line voltage to said reference word-line when so indicated by said strobe signal; and a comparator, connected to said reference word-line and to said reference word-line voltage;

wherein said comparator activates said sensing indication signal when said reference word-line achieves a predetermined function of said reference word-line voltage.

2. The delay device according to claim 1, wherein said reference word-line comprises a word-line.

3. The delay device according to claim 1, wherein said reference word-line comprises a portion of a word-line.

4. The delay device according to claim 1, wherein said comparator forms part of an array and wherein said comparator is active only when said array is in an active mode.

5. A delay device for determining a data sensing delay, the delay device comprising:

a reference word-line;

a comparator, connected to said reference word-line and to a reference word-line voltage;

wherein said comparator activates a sensing signal when the voltage on said reference word-line achieves a predetermined function of said reference word-line voltage.

6. The delay device according to claim 5, wherein said reference word-line comprises a word-line.

7. The delay device according to claim 5, wherein said reference word-line comprises a portion of a word-line.

8. A memory array comprising:

an array of memory cells having regular word-lines connecting rows of said memory cells and bit lines connecting columns of said memory cells, said array also including a reference word-line in addition to said regular word-lines;

a Y-decoder connected to said bit lines for selecting at least one bit line;

an X-decoder connected to said regular word-lines for selecting a regular word-line;

a sensing amplifier connected to said Y-decoder for sensing the value present on said selected bit line; and a delay device connected to said sensing amplifier and to said reference word-line for activating said sensing amplifier once said reference word-line achieves a predetermined voltage level.

9. An array according to claim 8 wherein said X-decoder comprises an address decoder for selecting said regular word-line, a plurality of word-line drivers connected to said regular word-lines and wherein said address decoder has a first and a second stage, wherein said second stage is activated by a strobe signal and charges a selected one of said word-line drivers once activated.

10. An array according to claim 9 wherein said delay device includes a reference word-line driver and a second stage emulator which is activated by said strobe signal and charges said reference word-line driver once activated.

11. An array according to claim 8 wherein said delay device includes a comparator, connected to said reference word-line and to a reference word-line voltage, and produces an activation signal when the voltage on said reference word-line is at least equal to a predetermined function of said reference word-line voltage.

12. A memory array comprising:

an array of memory cells having word-lines connecting rows of said memory cells and bit lines connecting columns of said memory cells, said array also including a reference word-line;

a Y-decoder connected to said bit lines for selecting at least one bit line;

a strobable X-decoder connected to said word-lines for charging a selected one of said word-lines when a strobe signal is received;

a sensing amplifier connected to said Y-decoder for sensing the value present on said selected bit line; and a delay device connected to said sensing amplifier for activating said sensing amplifier once said reference word-line achieves a predetermined voltage level.

13. An array according to claim 12 and wherein said delay device includes a reference word-line driver and a second stage emulator which is activated by said strobe signal and charges said reference word-line driver once activated.

14. An array according to claim 12 and wherein said delay device includes a comparator, connected to said reference word-line and to a reference word-line voltage, and produces an activation signal when the voltage on said reference word-line is at least equal to a predetermined function of said reference word-line voltage.

* * * * *